United States Patent
Sadaka et al.

(10) Patent No.: US 8,617,925 B2
(45) Date of Patent: Dec. 31, 2013

(54) METHODS OF FORMING BONDED SEMICONDUCTOR STRUCTURES IN 3D INTEGRATION PROCESSES USING RECOVERABLE SUBSTRATES, AND BONDED SEMICONDUCTOR STRUCTURES FORMED BY SUCH METHODS

(75) Inventors: Mariam Sadaka, Austin, TX (US); Bich-Yen Nguyen, Austin, TX (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/206,280

(22) Filed: Aug. 9, 2011

(65) Prior Publication Data

US 2013/0037960 A1   Feb. 14, 2013

(51) Int. Cl.
*H01L 23/538* (2006.01)
*H01L 21/58* (2006.01)
*H01L 21/768* (2006.01)

(52) U.S. Cl.
USPC ............. 438/109; 257/E21.499; 257/E21.597

(58) Field of Classification Search
None
See application file for complete search history.

(56) References Cited

U.S. PATENT DOCUMENTS

| | | |
|---|---|---|
| 6,303,468 B1 | 10/2001 | Aspar et al. |
| 6,335,258 B1 | 1/2002 | Aspar et al. |
| 6,756,286 B1 | 6/2004 | Moriceau et al. |
| 6,809,044 B1 | 10/2004 | Aspar et al. |
| 6,946,365 B2 | 9/2005 | Aspar et al. |
| 7,351,608 B1 | 4/2008 | Mountain |
| 2005/0094926 A1 | 5/2005 | Dominic et al. |
| 2005/0100345 A1 | 5/2005 | Welch et al. |
| 2005/0108664 A1 | 5/2005 | Johnston |
| 2005/0111848 A1 | 5/2005 | Grubb |
| 2005/0129350 A1 | 6/2005 | Welch |
| 2005/0135729 A1 | 6/2005 | Welch |
| 2005/0135731 A1 | 6/2005 | Welch |
| 2005/0169640 A1 | 8/2005 | Grubb |
| 2005/0213883 A1 | 9/2005 | Welch |
| 2005/0269680 A1 | 12/2005 | Hsuan |
| 2006/0018587 A1 | 1/2006 | Lakshminarayana |
| 2006/0062519 A1 | 3/2006 | Kish |
| 2006/0093369 A1 | 5/2006 | Nagarajan |
| 2006/0159387 A1 | 7/2006 | Handelman |
| 2006/0159411 A1 | 7/2006 | Miller |
| 2006/0182441 A1 | 8/2006 | Kish |
| 2006/0228067 A1 | 10/2006 | Joyner |

(Continued)

OTHER PUBLICATIONS

Bakir et al., 3D Heterogeneous Integrated Systems: Liquid Cooling, Power Delivery, and Implementation, IEEE 2008 Custom Intergrated Circuits Conference (CICC), pp. 663-670.

(Continued)

*Primary Examiner* — Zandra Smith
*Assistant Examiner* — Pamela E Perkins
(74) *Attorney, Agent, or Firm* — TraskBritt

(57) ABSTRACT

Methods of forming bonded semiconductor structures include forming through wafer interconnects through a layer of material of a first substrate structure, bonding one or more semiconductor structures over the layer of material, and electrically coupling the semiconductor structures with the through wafer interconnects. A second substrate structure may be bonded over the processed semiconductor structures on a side thereof opposite the first substrate structure. A portion of the first substrate structure then may be removed, leaving the layer of material with the through wafer interconnects therein attached to the processed semiconductor structures. At least one through wafer interconnects then may be electrically coupled to a conductive feature of another structure, after which the second substrate structure may be removed. Bonded semiconductor structures are formed using such methods.

20 Claims, 8 Drawing Sheets

(56) References Cited

U.S. PATENT DOCUMENTS

| | | |
|---|---|---|
| 2006/0239612 A1 | 10/2006 | De Dobbelaere |
| 2006/0245754 A1 | 11/2006 | Valette |
| 2006/0251426 A1 | 11/2006 | Mazed |
| 2007/0019901 A1 | 1/2007 | Kish |
| 2007/0086702 A1 | 4/2007 | Peters |
| 2007/0172169 A1 | 7/2007 | Kish |
| 2007/0183737 A1 | 8/2007 | Joyner |
| 2007/0183738 A1 | 8/2007 | Welch |
| 2007/0222065 A1 | 9/2007 | Andry et al. |
| 2007/0242919 A1 | 10/2007 | Welch |
| 2007/0248299 A1 | 10/2007 | Welch |
| 2007/0269160 A1 | 11/2007 | Handelman |
| 2007/0269214 A1 | 11/2007 | Handelman |
| 2007/0269220 A1 | 11/2007 | Handelman |
| 2007/0269221 A1 | 11/2007 | Handelman |
| 2007/0274630 A1 | 11/2007 | Ghiron |
| 2008/0013881 A1 | 1/2008 | Welch |
| 2008/0025726 A1 | 1/2008 | Welch |
| 2008/0031626 A1 | 2/2008 | Welch |
| 2008/0037928 A1 | 2/2008 | Handelman |
| 2008/0138088 A1 | 6/2008 | Welch |
| 2009/0022452 A1 | 1/2009 | Welch |
| 2009/0051046 A1 | 2/2009 | Yamazaki et al. |
| 2009/0092354 A1 | 4/2009 | Joyner |
| 2009/0154917 A1 | 6/2009 | Handelman |
| 2009/0202196 A1 | 8/2009 | Kish, Jr. |
| 2009/0220191 A1 | 9/2009 | Evans |
| 2009/0238557 A1 | 9/2009 | Chen et al. |
| 2009/0245719 A1 | 10/2009 | Nagarajan |
| 2009/0245795 A1 | 10/2009 | Joyner |
| 2009/0257706 A1 | 10/2009 | Rasras |
| 2009/0317033 A1 | 12/2009 | Shih |
| 2010/0183043 A1 | 7/2010 | Rigole et al. |
| 2010/0225002 A1* | 9/2010 | Law et al. .............. 257/774 |
| 2010/0247028 A1 | 9/2010 | Nagarajan |
| 2010/0254420 A1 | 10/2010 | Corzine |
| 2010/0290735 A1 | 11/2010 | Joyner |
| 2011/0020982 A1 | 1/2011 | Wimplinger |
| 2011/0193221 A1 | 8/2011 | Hu et al. |

OTHER PUBLICATIONS

Bakir et al., Electrical, Optical, and Fluidic Interconnect Networks for 3D Heterogeneous Integrated Systems, IEEE 2008, 978-1-4244-1920-3, pp. 7-8.
Bakir et al., Revolutionary NanoSilicon Ancillary Technologies for Ultimate-Performance Gigascale Systems, IEEE 2007 Custom Intergrated Circuits Conference (CICC), pp. 421-428.
King, Jr. et al., 3D Stacking of Chips with Electrical and Microfluidic I/O Interconnects, 2008 Electronic Components and Technology Conference, pp. 1-7.
Liu et al., Ge-on-Si Laser Operating at Room Temperature, Optics Letters, Vo. 35, No. 5, Mar. 1, 2010, pp. 679-681.
Leduc et al., First Integration of Cu TSV Using Die-to-Wafer Direct Bonding and Planarization, 3D System Integration, 2009. 3DIC 2009. IEEE International Conference, Sep. 28-30, 2009, 5 pages.
Optoiq, Silicon Photonics: Ge-on-Si Emitter Moves Silicon Photonics Ahead, Jun. 1, 2009, 3 pages.
Sadaka et al., U.S. Appl. No. 12/837,326 entitled Methods of Forming Bonded Semiconductor Structures, and Semiconductor Structures Formed by Such Methods, filed Jul. 15, 2010.
Sun et al., Electrically Pumped Hybrid Evanescent Si/InGaAsP Lasers, Optics Letters, vol. 34, No. 9, May 1, 2009, pp. 1345-1347.
Sun et al., Room-Temperature Direct Bandgap Electroluminescence from Ge-on-Si Light-Emitting Diodes, Optics Letters, vol. 34, No. 8, Apr. 15, 2009, pp. 1198-1200.
French Search Report and Opinion for French Application No. 1157422 dated Apr. 30, 2012, 10 pages.

* cited by examiner

METHODS OF FORMING BONDED SEMICONDUCTOR STRUCTURES IN 3D INTEGRATION PROCESSES USING RECOVERABLE SUBSTRATES, AND BONDED SEMICONDUCTOR STRUCTURES FORMED BY SUCH METHODS

TECHNICAL FIELD

The present invention relates to methods of forming bonded semiconductor structures using three-dimensional integration (3D) techniques, and to bonded semiconductor structures formed by such methods.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device footprint. See, for example, P. Garrou et al., "The Handbook of 3D Integration," Wiley-VCH (2008).

The 3D integration of semiconductor structures may take place by the attachment of a semiconductor die to one or more additional semiconductor dice (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

The bonding techniques used in bonding one semiconductor structure to another semiconductor structure may be categorized in different ways, one being whether a layer of intermediate material is provided between the two semiconductor structures to bond them together, and the second being whether the bonding interface allows electrons (i.e., electrical current) to pass through the interface. So called "direct bonding methods" are methods in which a direct solid-to-solid chemical bond is established between two semiconductor structures to bond them together without using an intermediate bonding material between the two semiconductor structures to bond them together. Direct metal-to-metal bonding methods have been developed for bonding metal material at a surface of a first semiconductor structure to metal material at a surface of a second semiconductor structure.

Direct metal-to-metal bonding methods may also be categorized by the temperature range in which each is carried out. For example, some direct metal-to-metal bonding methods are carried out at relatively high temperatures resulting in at least partial melting of the metal material at the bonding interface. Such direct bonding processes may be undesirable for use in bonding processed semiconductor structures that include one or more device structures, as the relatively high temperatures may adversely affect the earlier formed device structures.

"Thermo-compression bonding" methods are direct bonding methods in which pressure is applied between the bonding surfaces at elevated temperatures between two hundred degrees Celsius (200° C.) and about five hundred degrees Celsius (500° C.), and often between about three hundred degrees Celsius (300° C.) and about four hundred degrees Celsius (400° C.).

Additional direct bonding methods have been developed that may be carried out at temperatures of two hundred degrees Celsius (200° C.) or less. Such direct bonding processes carried out at temperatures of two hundred degrees Celsius (200° C.) or less are referred to herein as "ultra-low temperature" direct bonding methods. Ultra-low temperature direct bonding methods may be carried out by careful removal of surface impurities and surface compounds (e.g., native oxides), and by increasing the area of intimate contact between the two surfaces at the atomic scale. The area of intimate contact between the two surfaces is generally accomplished by polishing the bonding surfaces to reduce the surface roughness up to values close to the atomic scale, by applying pressure between the bonding surfaces resulting in plastic deformation, or by both polishing the bonding surfaces and applying pressure to attain such plastic deformation.

Some ultra-low temperature direct bonding methods may be carried out without applying pressure between the bonding surfaces at the bonding interface, although pressure may be applied between the bonding surfaces at the bonding interface in other ultra-low temperature direct bonding methods in order to achieve suitable bond strength at the bonding interface. Ultra-low temperature direct bonding methods in which pressure is applied between the bonding surfaces are often referred to in the art as "surface-assisted bonding" or "SAB" methods. Thus, as used herein, the terms "surface-assisted bonding" and "SAB" mean and include any direct bonding process in which a first material is directly bonded to a second material by abutting the first material against the second material and applying pressure between the bonding surfaces at the bonding interface at a temperature of two hundred degrees Celsius (200° C.) or less.

Silicon (Si) and glass substrates are commonly perceived as base substrates on which semiconductor devices may be fabricated to enable high bandwidth performance, and for use in first level heterogeneous three-dimensional integration. Interposes are generally planar structures that comprise layers of material, which are interposed between two or more different dice and/or wafers in three-dimensional integration processes. Interposers are used in intermediate processing steps during three-dimensional integrated circuit (3D-IC) integration. The main drivers for silicon interposers are the greater need for high-density chip-to-package interconnects, coefficient of thermal expansion (CTE) matching (e.g., Si on Si), and a greater emphasis on integrating passive devices (e.g., resistors, inductors etc.) into the interposer. For example, interposers may incorporate through substrate vias (TSVs), as well as decoupling capacitors and voltage regulators. In addition, significantly reduced form factors may be achieved on a silicon interposer.

Commonly, silicon interposers are thinned after the formation of the through substrate vias (TSVs) and redistribution layers (RDL) in and on the silicon interposers. Such thinning processes often involve wastage of expensive silicon material. In addition, interposers are usually thinned with copper-filled TSVs and RDL layers. Mechanical strain may build in the interposer after fabrication of the TSVs and RDL layers, and after thinning the interposer. This strain may cause warping of the interposer and may result in fracture or other mechanical damage to the interposer. A warped interposer may also warp the Known Good Die (KGD) that may be mounted upon it, thus significantly affecting the yield of operable devices fabricated on or over the interposer.

BRIEF SUMMARY

This summary is provided to introduce a selection of concepts in a simplified form. These concepts are described in further detail in the detailed description of example embodiments of the invention below. This summary is not intended to identify key features or essential features of the claimed subject matter, nor is it intended to be used to limit the scope of the claimed subject matter.

In some embodiments, the present disclosure includes three-dimensional integration techniques that make use of a recoverable substrate, and may provide solutions for overcoming yield-limiting challenges commonly encountered due to strain build-up in interposers. In addition, some embodiments may involve direct bonding techniques for allowing low temperature and low pressure positioning and bonding of structures in three-dimensional integration processes.

In some embodiments, the present invention includes methods of forming bonded semiconductor structures. In accordance with such methods, a first substrate structure may be provided that comprises a relatively thin layer of material on a relatively thick substrate body. A plurality of through wafer interconnects may be formed through the relatively thin layer of material of the first substrate structure. At least one processed semiconductor structure may be bonded over the relatively thin layer of material of the first substrate structure on a side thereof opposite the relatively thick substrate body, and at least one conductive feature of the at least one processed semiconductor structure may be electrically coupled with at least one through wafer interconnect of the plurality of through wafer interconnects. A second substrate structure may be bonded over the at least one processed semiconductor structure on a side thereof opposite the first substrate structure. The relatively thick substrate body of the first substrate structure may be removed, leaving the relatively thin layer of material of the first substrate structure bonded to the at least one processed semiconductor structure. At least one through wafer interconnect of the plurality of through wafer interconnects may be electrically coupled to a conductive feature of another structure.

In additional embodiments, the present invention includes bonded semiconductor structures formed from methods as disclosed herein. For example, an embodiment of a bonded semiconductor structure of the present invention may include a first substrate structure comprising a plurality of through wafer interconnects extending through a relatively thin layer of material, and a relatively thick substrate body temporarily bonded to the layer of material. A plurality of processed semiconductor structures may be electrically coupled to the plurality of through wafer interconnects, and a second substrate structure may be temporarily bonded over the plurality of processed semiconductor structures on a side thereof opposite the first substrate structure.

BRIEF DESCRIPTION OF THE DRAWINGS

While the specification concludes with claims particularly pointing out and distinctly claiming what are regarded as embodiments of the invention, the advantages of embodiments of the invention may be more readily ascertained from the description of certain examples of embodiments of the invention when read in conjunction with the accompanying drawings, in which:

DETAILED DESCRIPTION

Figure 1A:
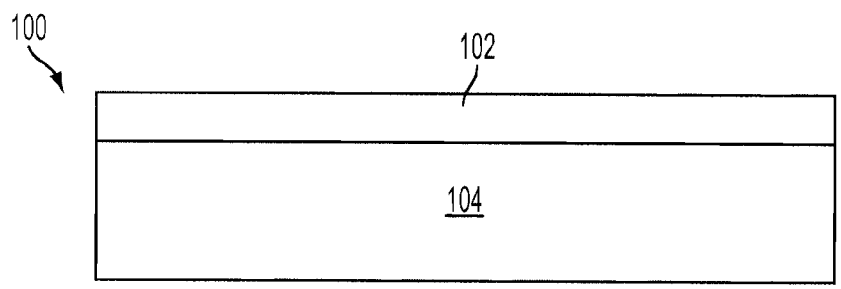
FIGS. 1A through 1L are simplified cross-sectional views of semiconductor structures and depict the formation of a bonded semiconductor structure in accordance with example embodiments of the invention.

The illustrations presented herein are not meant to be actual views of any particular semiconductor structure, device, system, or method, but are merely idealized representations that are used to describe embodiments of the invention.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

As used herein, the term "semiconductor structure" means and includes any structure that is used in the formation of a semiconductor device. Semiconductor structures include, for example, dice and wafers (e.g., carrier substrates and device substrates), as well as assemblies or composite structures that include two or more dice and/or wafers three-dimensionally integrated with one another. Semiconductor structures also include fully fabricated semiconductor devices, as well as intermediate structures formed during fabrication of semiconductor devices.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "bonded semiconductor structure" means and includes any structure that includes two or more semiconductor structures that are attached together. Bonded semiconductor structures are a subset of semiconductor structures, and all bonded semiconductor structures are semiconductor structures. Furthermore, bonded semiconductor structures that include one or more processed semiconductor structures are also processed semiconductor structures.

As used herein, the term "device structure" means and includes any portion of a processed semiconductor structure that is, includes, or defines at least a portion of an active or passive component of a semiconductor device to be formed on or in the semiconductor structure. For example, device structures include active and passive components of integrated circuits such as transistors, transducers, capacitors, resistors, conductive lines, conductive vias, and conductive contact pads.

As used herein, the term "through wafer interconnect" or "TWI" means and includes any conductive via extending through at least a portion of a first semiconductor structure that is used to provide a structural and/or an electrical interconnection between the first semiconductor structure and a second semiconductor structure across an interface between the first semiconductor structure and the second semiconductor structure. Through wafer interconnects are also referred to in the art by other terms, such as "through silicon vias," "through substrate vias," "through wafer vias," or abbreviations of such terms, such as "TSVs" or "TWVs." TWIs typically extend through a semiconductor structure in a direction generally perpendicular to the generally flat, major surfaces of the semiconductor structure (i.e., in a direction parallel to the "Z" axis).

In accordance with some embodiments of the invention, recoverable substrate structures are temporarily bonded to semiconductor structures and utilized in the formation of bonded semiconductor structures. The recoverable substrate structures are removed from the semiconductor structures at different points in the process of forming the bonded semiconductor structures.

The recoverable substrate structures may provide support to interposers throughout process stages. In addition, the debondable interface therebetween can be engineered in order to control the aspect ratio of the TSV and the final interposer thickness (i.e., a thinner interposer results in a lower TSV aspect ratio).

Figure 1B:
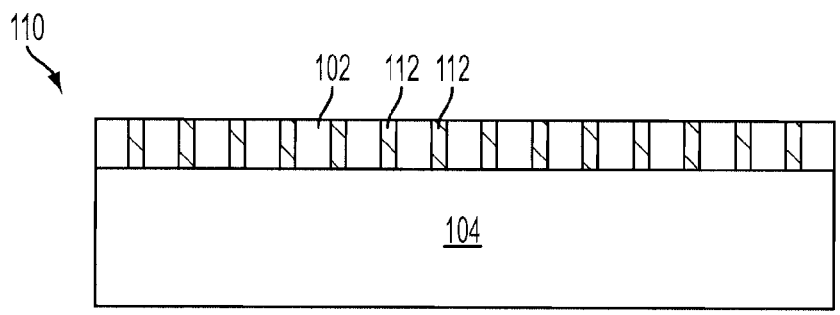
Figure 1C:
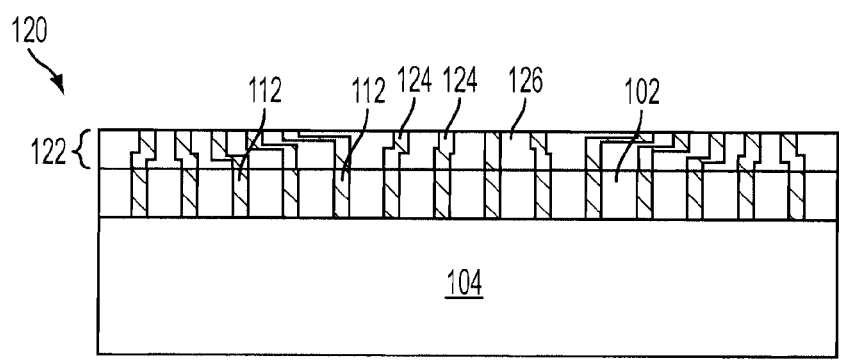

FIGS. 1A through 1C illustrate the fabrication of a substrate structure 120 (FIG. 1C) that may be employed in some embodiments of the invention. Referring to FIG. 1A, a substrate structure 100 is provided that includes a relatively thin layer of material 102 on a relatively thick substrate body 104. In some embodiments, the substrate structure 100 may comprise a wafer-scale substrate having an average diameter of several hundred millimeters or more. By way of example and not limitation, the relatively thin layer of material 102 may have an average thickness of about two hundred microns (200 µm) or less, about one hundred microns (100 µm) or less, or even about fifty microns (50 µm) or less. The relatively thick substrate body 104 may have an average thickness of, for example, between about three hundred microns (300 µm) and seven hundred and fifty microns (750 µm) or higher.

The relatively thin layer of material 102 may comprise a semiconductor material such as, for example, silicon or germanium. Such a semiconductor material may be polycrystalline or at least substantially comprised of single crystal material, and may be doped or undoped. In additional embodiments, the relatively thin layer of material 102 may comprise a ceramic material, such as an oxide (e.g., silicon oxide ($SiO_2$), aluminum oxide ($Al_2O_3$), etc.) a nitride (e.g., silicon nitride ($Si_3N_4$), boron nitride (BN), etc.), or an oxynitride (e.g., silicon oxynitride (SiON)).

The relatively thick substrate body 104 may have a composition different from that of the relatively thin layer of material 102, but may itself comprise a semiconductor material or a ceramic material as mentioned in relation to the thin layer of material 102. In additional embodiments, the relatively thick substrate body 104 may comprise a metal or metal alloy.

In some embodiments, the relatively thin layer of material 102 may be temporarily attached to the relatively thick substrate body 104 using temporary bonding techniques such as those disclosed in U.S. patent application Ser. No. 12/837,326, which was filed Jul. 15, 2010 in the name of Sadaka et al., now U.S. Pat. No. 8,481,406, issued Jul. 9, 2013, and which is incorporated herein in its entirety by this reference.

The relatively thick substrate body 104 may comprise a recoverable and reusable portion of the substrate structure 100, as discussed in further detail below.

Referring to FIG. 1B, a plurality of through wafer interconnects 112 may be formed through the relatively thin layer of material 102 to form the substrate structure 110 of FIG. 1B. Various processes for forming through wafer interconnects 112 are known in the art and may be employed in embodiments of the present invention. As a non-limiting example, a patterned mask layer may be provided over the exposed major surface of the thin layer of material 102. The patterned mask layer may include apertures extending therethrough at the locations at which it is desired to form the through wafer interconnects 112 through the thin layer of material 102. An etching process (e.g., an isotropic wet chemical etching process or an anisotropic dry reactive ion etching process) then may be used to etch via holes through the thin layer of material 102. A further example may comprise laser drilling over the exposed major surface of the thin layer of material 102 to form via holes. After forming the via holes, the patterned mask layer may be removed, and the via holes may be filled with one or more conductive metals or metal alloys (e.g., copper or a copper alloy), or polysilicon, to form the through wafer interconnects 112. For example, one or more of a physical vapor deposition (PVD) process, a chemical vapor deposition (CVD) process, an electroless plating process, and an electrolytic plating process may be used to provide the conductive material in the via holes and form the through wafer interconnects 112.

After forming the plurality of through wafer interconnects 112 through the relatively thin layer of material 102, one or more redistribution layers (RDLs) 122 may be formed over the thin layer of material 102 on a side thereof opposite the relatively thick substrate body 104 to form the substrate structure 120 shown in FIG. 1C. As known in the art, redistribution layers may be used to redistribute the locations of electrical features of a first structure or device so as to accommodate a pattern of conductive features on another structure or device to be coupled thereto. In other words, a redistribution layer may have a first pattern of conductive features on a first side of the redistribution layer and a second, different pattern of conductive features on an opposing second side of the redistribution layer. As shown in FIG. 1C, the redistribution layer 122 may comprise a plurality of conductive features 124 that are disposed within and surrounded by a dielectric material 126. The conductive features 124 may include one or more of conductive pads, laterally extending conductive lines or traces, and vertically extending conductive vias. Furthermore, the redistribution layer 122 may comprise a plurality of layers formed sequentially one over another, each layer comprising conductive features 124 and dielectric material 126, and the conductive features 124 of one layer may be in direct physical and electrical contact with conductive features 124 in adjacent layers, such that the conductive features 124 of the redistribution layer 122 extend continuously through the dielectric material 126 from one side of the redistribution layer 122 to the opposing side of the redistribution layer 122. On the side of the redistribution layer 122 adjacent the relatively thin layer of material 102 and the through wafer interconnects 112, the conductive features 124 of the redistribution layer 122 may be disposed in a pattern that is complementary to a pattern in which the through wafer interconnects 112 are disposed, such that the through wafer interconnects 112 are in direct physical and electrical contact with corresponding conductive features 124 of the redistribution layer 122. The pattern of the conductive features 124 of the redistribution layer 122 may be redistributed across the thickness of the redistribution layer 122 from one side thereof to the other, as described above.

The redistribution layer 122 may provide the capability of forming a customized routing pattern. For example, customized redistribution layers may be formed in a pattern that is a mirror image of the pattern of metallization layers upon a processed semiconductor structure or structures that will be later bonded on the surface of the relatively thin layer of material 102.

The redistribution layer 122 may also provide "fan-in" and/or "fan-out" capabilities. For example, with fan-in redistribution layers, the device structure (e.g., a chip device) limits the area available for contacts and passive device structures, in addition to other limitations due to proximity effects of the device structures. With fan-out redistribution layers, fan-in limitations may be eliminated, providing flexibility for routing using standard CMOS backend processing. Passive devices formed in such redistribution layers may make use of the availability of thick metals and low-k dielectrics. As a result, they can exhibit performance characteristics that are improved compared to passive devices manufactured on the device structure (e.g., a chip device).

Figure 1D:
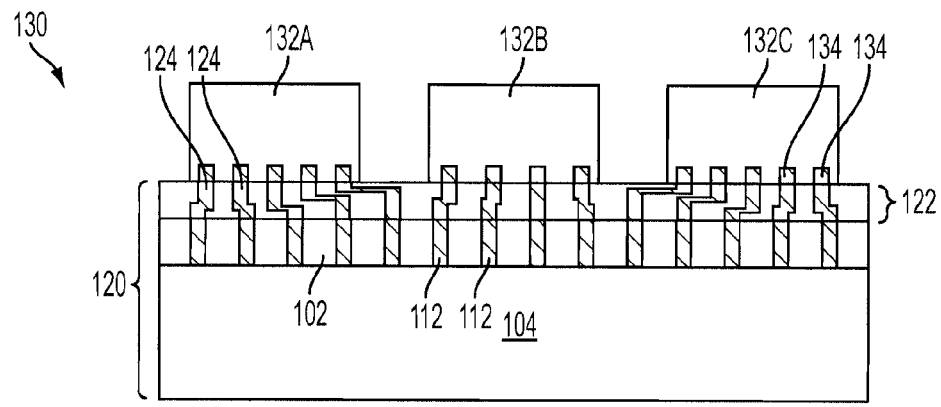

Referring to FIG. 1D, after forming the redistribution layer 122, at least one processed semiconductor structure 132A may be bonded over the relatively thin layer of material 102 of the substrate structure 120 on a side thereof opposite the relatively thick substrate body 104 to form a structure 130. For example, the at least one processed semiconductor structure 132A may be bonded directly to the redistribution layer 122, as shown in FIG. 1D In some embodiments, a plurality of processed semiconductor structures 132A, 132B, 132C may be bonded to the redistribution layer 122 over the relatively thin layer of material 102 of the substrate structure 120 on a side thereof opposite the relatively thick substrate body 104, as shown in FIG. 1D. The plurality of processed semiconductor structures 132A, 132B, 132C may be disposed laterally beside one another along a common plane oriented parallel to a major surface of the first substrate structure 120, as shown in FIG. 1D. In other words, each of the plurality of processed semiconductor structures 132A, 132B, 132C may occupy a different area over the substrate structure 120, and may be positioned such that a plane may be drawn parallel to a major surface of the first substrate structure 120 that passes through each of the processed semiconductor structures 132A, 132B, 132C.

The one or more processed semiconductor structures 132A, 132B, 132C may comprise, for example, semiconductor dice (fabricated from silicon or other semiconductor materials), and may include one or more of electronic signal processors, memory devices, microelectromechanical systems (MEMS), and optoelectronic devices (e.g., light-emitting diodes, lasers, photodiodes, solar cells, etc.).

In bonding the processed semiconductor structures 132A, 132B, 132C to the substrate structure 120, conductive features 134 of the processed semiconductor structures 132A, 132B, 132C may be electrically coupled with the conductive features 124 of the redistribution layer 122 and the through wafer interconnects 112 extending through the relatively thin layer of material 102.

The bonding process used to bond the processed semiconductor structures 132A, 132B, 132C to the substrate structure 120 may be performed at a temperature or temperatures of about 400° C. or less. In some embodiments, the processed semiconductor structures 132A, 132B, 132C may be bonded to the substrate structure 120 using a thermo-compression direct bonding process performed at a temperature or temperatures of about 400° C. or less. In additional embodiments, the processed semiconductor structures 132A, 132B, 132C may be bonded to the substrate structure 120 using an ultra-low temperature direct bonding process performed at a temperature or temperatures of about 200° C. or less. In some instances, the bonding process may be performed at about room temperature. Performing the bonding process at such lower temperatures may avoid unintentional damage to device structures in the processed semiconductor structures 132A, 132B, 132C. Additionally, the bonding process may comprise a surface-assisted bonding process in some embodiments. The direct bonding process may comprise an oxide-to-oxide (e.g., silicon dioxide-to-silicon dioxide) direct bonding process, and/or a metal-to-metal (e.g., copper-to-copper) direct bonding process.

In some embodiments, additional processed semiconductor structures may be stacked over and electrically and physically coupled with the processed semiconductor structures 132A, 132B, 132C using one or more three-dimensional (3D) integration processes. Examples of such processes are described below with reference to FIGS. 1E through 1H.

Figure 1E:
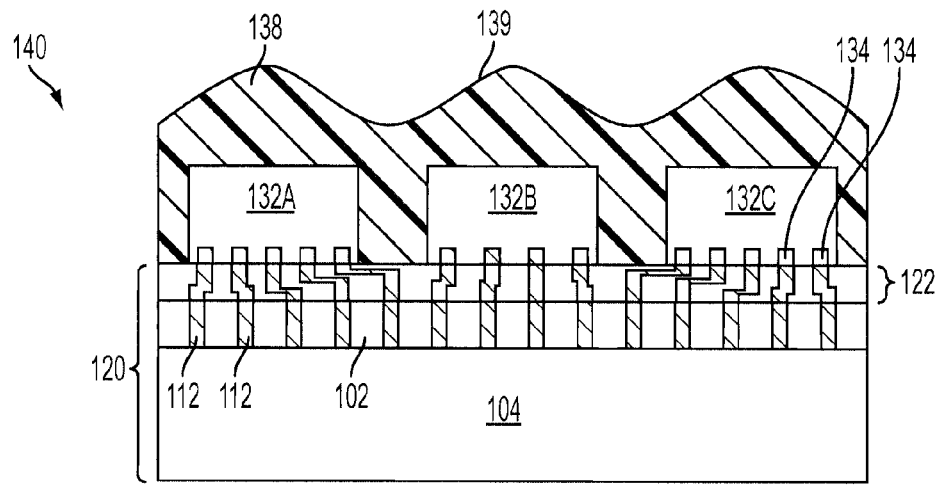

Referring to FIG. 1E, after bonding the processed semiconductor structures 132A, 132B, 132C to the substrate structure 120, a low stress dielectric material 138 may be deposited over and around the processed semiconductor structures 132A, 132B, 132C to form the structure 140 of FIG. 1E. The dielectric material 138 may comprise, for example, a polymer material or an oxide material (e.g., silicon oxide), and may be deposited using, for example, a spin-on process or a chemical vapor deposition (CVD) process or a physical vapor deposition (PVD) process.

The dielectric material 138 may be deposited in a conformal manner over the structure 130 of FIG. 1D such that an exposed major surface 139 of the dielectric material 138 comprises peaks and valleys. The peaks may be located over the processed semiconductor structures 132A, 132B, 132C, and the valleys may be located over the regions between the processed semiconductor structures 132A, 132B, 132C, as shown in FIG. 1E.

Figure 1F:
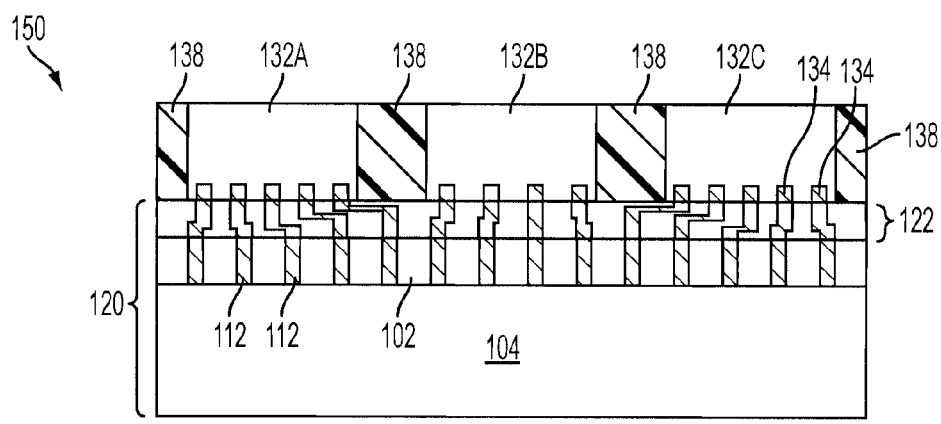

Referring to FIG. 1F, the exposed major surface 139 of the dielectric material 138 may be planarized, and a portion of the dielectric material 138 may be removed to expose the processed semiconductor structures 132A, 132B, 132C through the dielectric material 138 and form the structure 150 shown in FIG. 1F. For example, a chemical etching process (wet or dry), a mechanical polishing process, or a chemical-mechanical polishing (CMP) process may be used to planarize the major surface 139 of the dielectric material 138, remove a portion of the dielectric material 138, and expose the processed semiconductor structures 132A, 132B, 132C through the dielectric material 138.

In some embodiments, the processed semiconductor structures 132A, 132B, 132C may comprise processed semiconductor structures having different heights. In such a case, the planarization of the dielectric material 138 may be performed to expose the processed semiconductor structure with the greatest height, followed by a combination of die thinning and dielectric polishing to planarize the structure 150.

Figure 1G:
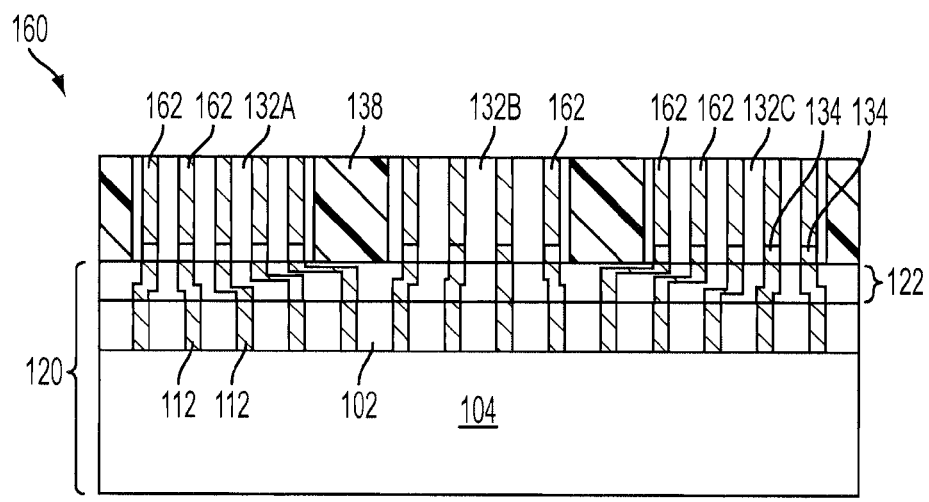

As shown in FIG. 1G, an additional plurality of through wafer interconnects 162 may be formed at least partially through the processed semiconductor structures 132A, 132B, 132C to form the structure 160. The additional through wafer interconnects 162 may be formed through the processed semiconductor structures 132A, 132B, 132C from the exposed major surfaces thereof to conductive features 134 within the processed semiconductor structures 132A, 132B, 132C. The through wafer interconnects 162 may be formed as previously described in relation to the formation of the through wafer interconnects 112. The processes, however, may be limited to temperatures of about 400° C. or less to avoid damaging device structures within the processed semiconductor structures 132A, 132B, 132C.

Figure 1H:
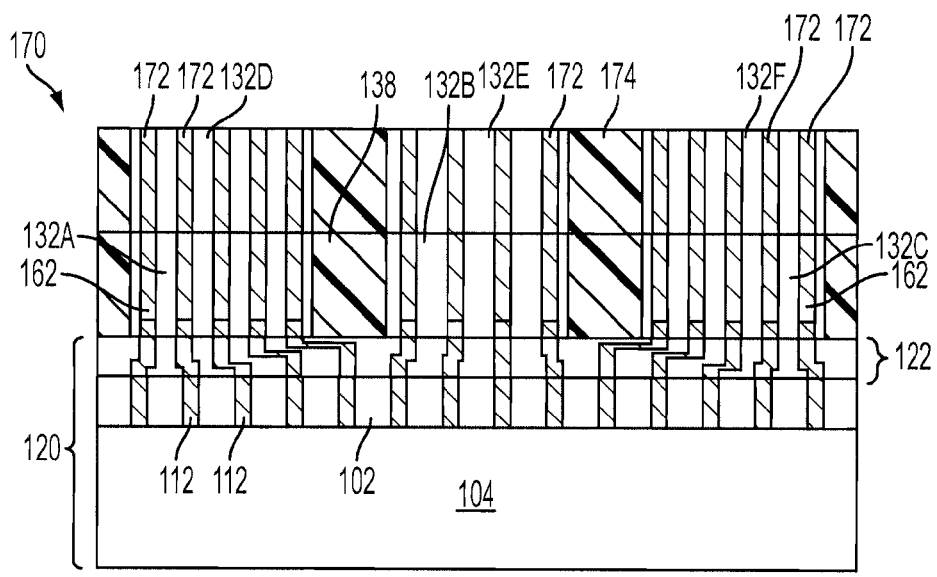

Referring to FIG. 1H, after forming the additional through wafer interconnects 162, the processes described above in relation to FIGS. 1D through 1G may be used to provide additional processed semiconductor structures 132D, 132E, 132F vertically over the processed semiconductor structures 132A, 132B, 132C and form the bonded semiconductor structure 170 shown in FIG. 1H. As an example, a processed semiconductor structure 132D may be directly bonded to the processed semiconductor structure 132A, a processed semiconductor structure 132E may be directly bonded to the processed semiconductor structure 132B, and a processed semiconductor structure 132F may be directly bonded to the processed semiconductor structure 132C. These bonding processes may be limited to temperatures of about 400° C. or less to avoid damaging device structures within the processed semiconductor structures 132A-132F, and may comprise a non-thermo-compression direct bonding process or an ultra-low temperature direct bonding process. Further, in some embodiments, the direct bonding processes may comprise surface-assisted bonding processes.

In this configuration, the processed semiconductor structures 132D, 132E, 132F are respectively disposed vertically over the processed semiconductor structures 132A, 132B, 132C along lines oriented perpendicular to the major surfaces of the first substrate structure 120. For example, the processed semiconductor structure 132A and the processed semiconductor structure 132D are disposed vertically over one another along a common line oriented perpendicular to the major surfaces of the first substrate structure 120. In other words, the processed semiconductor structure 132A and the processed semiconductor structure 132D are disposed such that a common line may be drawn perpendicular to the major surfaces of the first substrate structure 120 through each of the processed semiconductor structure 132A and the processed semiconductor structure 132D.

After bonding the processed semiconductor structures 132D, 132E, 132F to the processed semiconductor structures 132A, 132B, 132C, additional through wafer interconnects 172 may be formed at least partially through the processed semiconductor structures 132D, 132E, 132F. The additional through wafer interconnects 172 may be formed through the processed semiconductor structures 132D, 132E, 132F from the exposed major surfaces thereof to the through wafer interconnects 162 or other conductive features of the processed semiconductor structures 132A, 132B, 132C. The through wafer interconnects 172 may be formed as previously described in relation to the formation of the through wafer interconnects 112. The processes, however, may be limited to temperatures of about 400° C. or less to avoid damaging device structures within the processed semiconductor structures 132A-132F.

The processes described above in relation to FIGS. 1D-1G may be repeated one or more additional times as desired to vertically integrate any number of additional layers of processed semiconductor structures over the processed semiconductor structures 132A-132F in a three-dimensional (3D) integration process.

Figure 1I:
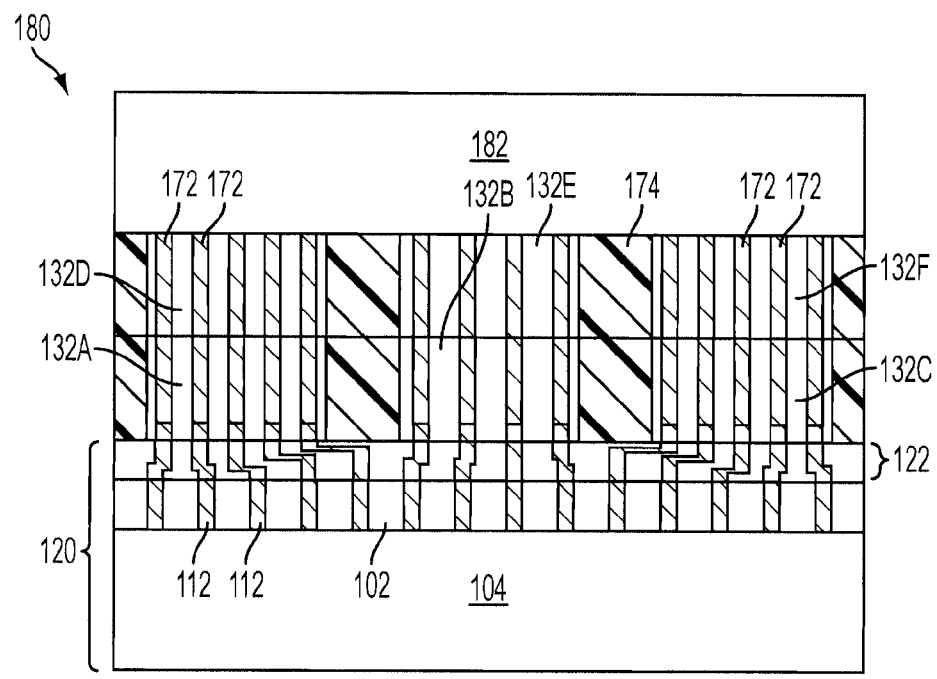

Referring to FIG. 1I, a second substrate structure 182 may be bonded over the processed semiconductor structures 132A-132F on a side thereof opposite the first substrate structure 120 to form the bonded semiconductor structure 180 shown in FIG. 1I.

The second substrate structure 182 may be at least substantially homogeneous in composition, or it may comprise a multi-layered structure including layers of materials having different compositions. As non-limiting examples, the second substrate structure 182 may comprise a semiconductor material such as, for example, silicon or germanium. Such a semiconductor material may be polycrystalline or at least substantially comprised of a single crystal material, and may be doped or undoped. In additional embodiments, the second substrate structure 182 may comprise a ceramic material, such as an oxide (e.g., silicon oxide ($SiO_2$), aluminum oxide ($Al_2O_3$), etc.) a nitride (e.g., silicon nitride ($Si_3N_4$), boron nitride (BN), etc.), or an oxynitride (e.g., silicon oxynitride (SiON)). The second substrate structure 182 also may comprise a metal or metal alloy in some embodiments.

The second substrate structure 182 may have an average thickness of, for example, between about one-half of a micron (0.5 μm) and several centimeters.

In some embodiments, the second substrate structure 182 may be temporarily attached to the semiconductor structure 170 of FIG. 1H using techniques, such as those described in the aforementioned U.S. patent application Ser. No. 12/837,326, filed Jul. 15, 2010, now U.S. Pat. No. 8,481,406, issued Jul. 9, 2013, in the name of Sadaka et al. The second substrate structure 182 may be directly bonded to exposed surfaces of one or more of a dielectric material 174 of the processed semiconductor structures 132D-132F, and the through wafer interconnects 172 of the processed semiconductor structures 132D-132F.

Figure 1J:
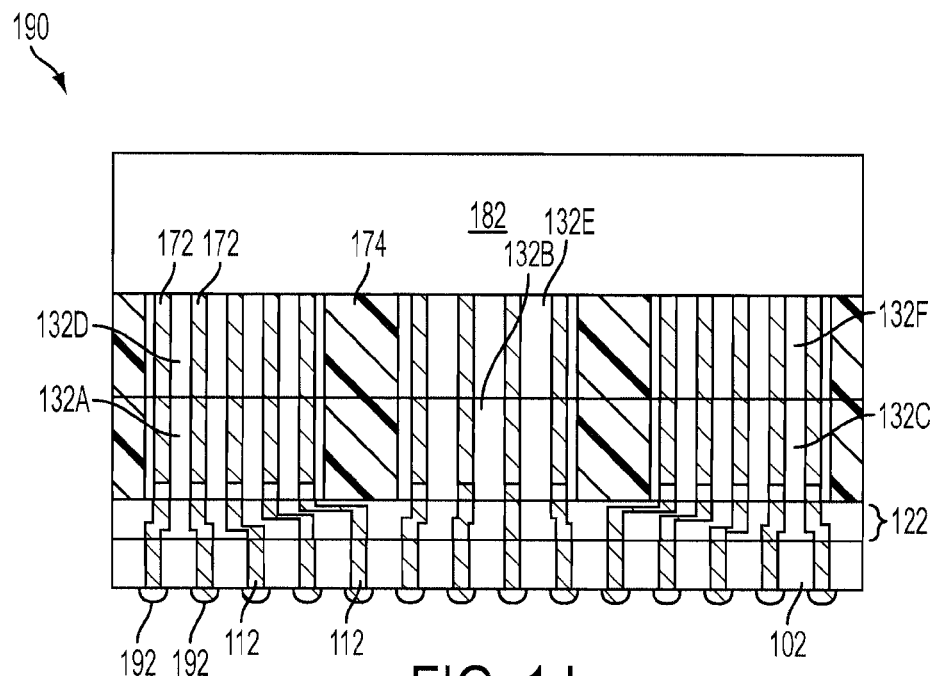

Referring to FIG. 1J, after temporarily bonding the second substrate structure 182 to the semiconductor structure 170 (FIG. 1H), the relatively thick substrate body 104 of the first substrate structure 120 may be de-bonded or otherwise removed, leaving the relatively thin layer of material 102 and the through wafer interconnects 112 extending therethrough bonded to the redistribution layer 122 and the processed semiconductor structures 132A-132F. For example, the relatively thick substrate body 104 may be separated and recovered from the relatively thin layer of material 102 in a manner that does not cause any significant or irreparable damage to the relatively thick substrate body 104.

Optionally, a conductive bump 192 may be provided on the exposed end of each of the through wafer interconnects 112 to form the bonded semiconductor structure 190 of FIG. 1J. The conductive bumps 192 may comprise a conductive metal or metal alloy, such as a reflowable solder alloy, and may be used to facilitate structurally and electrically coupling the through wafer interconnects 112 of the bonded semiconductor structure 190 to conductive features of another structure 202, which may be or include a higher level substrate or device.

Figure 1K:
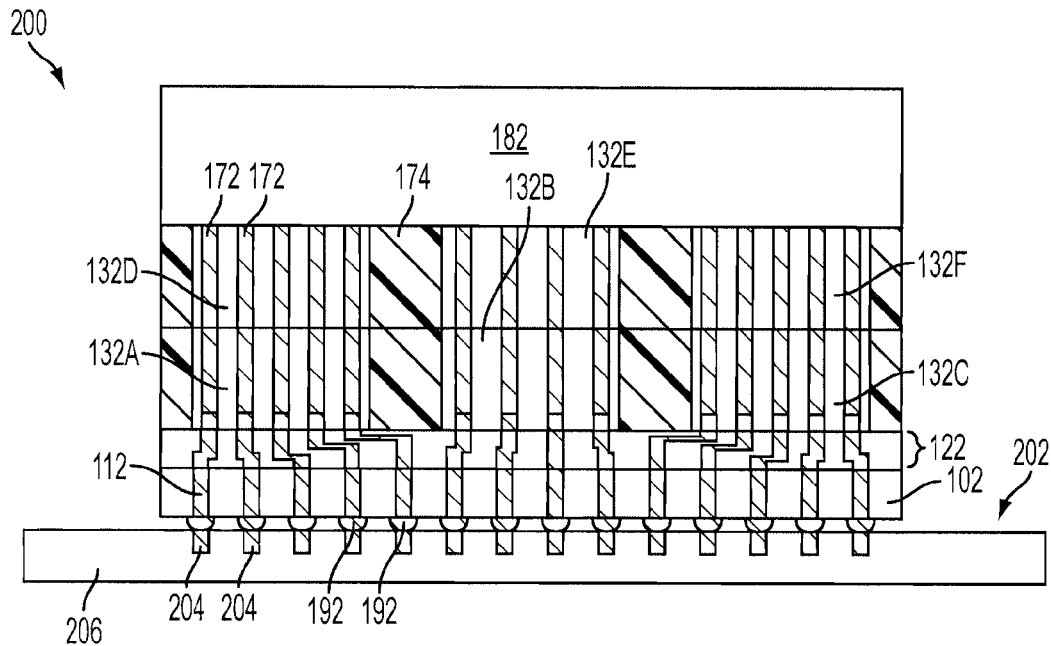

For example, as shown in FIG. 1K, the bonded semiconductor structure 190 of FIG. 1J may be structurally and electrically coupled to the structure 202. For example, the structure 202 may comprise another processed semiconductor structure or a printed circuit board. As shown in FIG. 1J, the structure 202 may comprise a plurality of conductive features 204 and a surrounding dielectric material 206. The conductive features 204 may comprise bond pads, for example. The conductive bumps 192 may be aligned with and abutted against the conductive features 204. The conductive bumps 192 may be heated to cause the material of the conductive bumps 192 to reflow, after which the material may be cooled and solidified, thereby forming a structural and electrical bond between the through wafer interconnects 112 and the conductive features 204 of the structure 202.

Figure 1L:
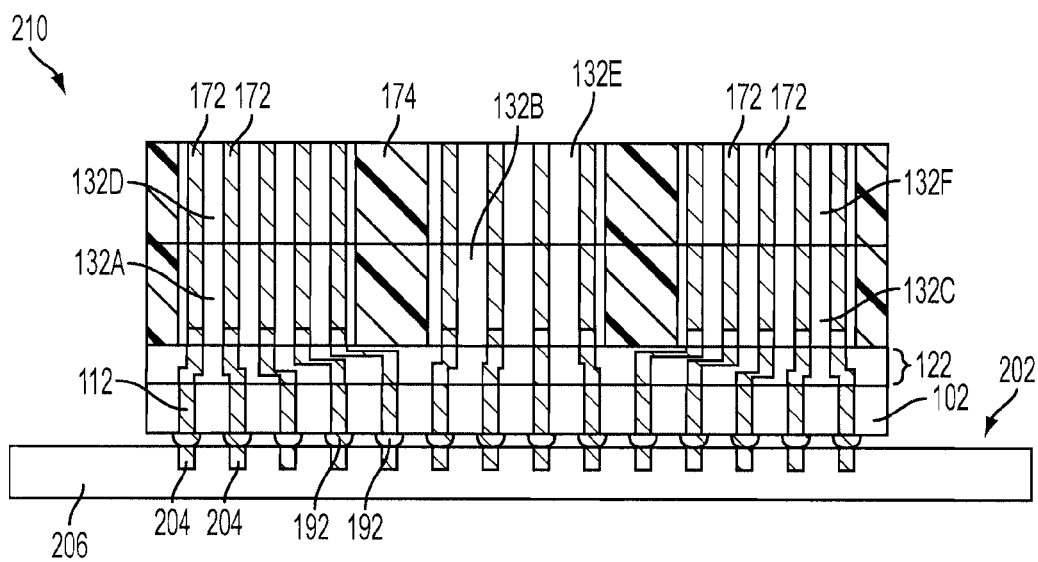

Referring to FIG. 1L, after structurally and electrically coupling the through wafer interconnects 112 to the conductive features 204 of the structure 202, the second substrate structure 182 (FIG. 1K) may be removed to form the bonded semiconductor structure 210 shown in FIG. 1L.

After removing each of the relatively thick substrate body 104 of the first substrate structure 120 and the second substrate structure 182 from the bonded semiconductor structures, the relatively thick substrate body 104 and/or the second substrate structure 182 may be recovered and reused. For example, the relatively thick substrate body 104 and/or the second substrate structure 182 may be reused one or more times in methods of forming bonded semiconductor structures (e.g., a bonded semiconductor structure like the bonded semiconductor structure 210 of FIG. 1L) as previously described herein.

The bonded semiconductor structure 210 of FIG. 1L may be further processed as needed or desirable in order to render the bonded semiconductor structure 210 suitable for its intended use. As a non-limiting example, a protective coating or encapsulating material may be provided over at least a portion of the bonded semiconductor structure 210, and/or a protective bonding material may be provided between the structure 202 and the layer of material 102 between and around the conductive bumps 192.

In some embodiments of the invention, one or more of the substrate structures that are temporarily bonded to, and ultimately removed from, semiconductor structures during methods of forming bonded semiconductor structures as described herein, may comprise a semiconductor-on-insulator (SeOI) substrate, such as a silicon-on-insulator (SOI) substrate.

Figure 2A:
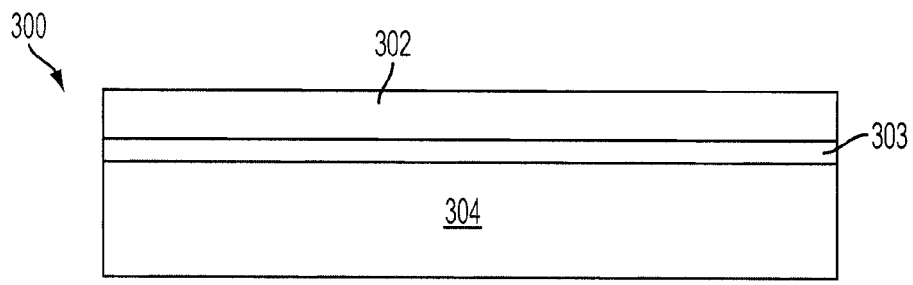
FIGS. 2A through 2C are simplified cross-sectional views of semiconductor structures and are used to describe additional embodiments of methods of forming bonded semiconductor structures of the invention.

For example, FIG. 2A illustrates an example of a semiconductor-on-insulator substrate 300 that may be employed in embodiments of the invention. The semiconductor-on-insulator substrate 300 includes a layer of semiconductor material 302 disposed over a dielectric insulator layer 303, which may be disposed on a relatively thick substrate body 304. In such substrate structures, the insulator layer 303 is often referred to as a "buried" layer, such as a "buried oxide" layer.

The layer of semiconductor material 302 and the insulator layer 303 may be relatively thin compared to the relatively thicker substrate body 304. By way of example and not limitation, the layer of semiconductor material 302 may have an average thickness of about ten microns (10 μm) or less, about one hundred nanometers (100 nm) or less, or even about ten nanometers microns (10 nm) or less. The insulator layer 303 may have an average thickness of about one micron (1 μm) or less, about two hundred nanometers (200 nm) or less, or even about ten nanometers (10 nm) or less. The relatively thick substrate body 304 may have an average thickness of, for example, between about seven hundred and fifty microns (750 μm) and several centimeters.

The layer of semiconductor material 302 may comprise a semiconductor material such as, for example, silicon or germanium. Such a semiconductor material may be polycrystalline or at least substantially comprised of a single crystal material, and may be doped or undoped. The insulator layer 303 may comprise a ceramic material, such as an oxide (e.g., silicon oxide ($SiO_2$), aluminum oxide ($Al_2O_3$), etc.) a nitride (e.g., silicon nitride ($Si_3N_4$), boron nitride (BN), etc.), or an oxynitride (e.g., silicon oxynitride (SiON)). The relatively thick substrate body 304 may have a composition different from that of the layer of semiconductor material 302 and/or the insulator layer 303, but may itself comprise a semiconductor material or a ceramic material as mentioned in relation to the layer of semiconductor material 302 and the insulator layer 303. In additional embodiments, the relatively thick substrate body 304 may comprise a metal or metal alloy, although silicon or another material selected to exhibit a matching CTE may be desirable.

Figure 2B:
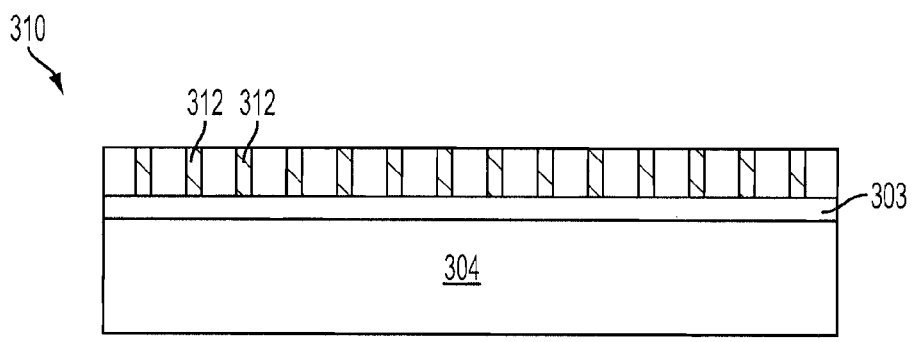

Referring to FIG. 2B, a plurality of through wafer interconnects 312 may be formed through the layer of semiconductor material 302, as previously discussed in relation to the through wafer interconnects 112 with reference to FIG. 1B, to form the substrate structure 310 shown in FIG. 2B. After forming the through wafer interconnects 312 through the layer of semiconductor material 302, the substrate structure 310 may be processed as previously described with reference to FIGS. 1C through 1I to form the bonded semiconductor structure 380 shown in FIG. 2C. The bonded semiconductor structure 380 is substantially similar to the bonded semiconductor structure 180 of FIG. 1I, but includes the substrate structure 310 of FIG. 2B, with a redistribution layer 122 thereon, substituted for the first substrate structure 120.

Figure 2C:
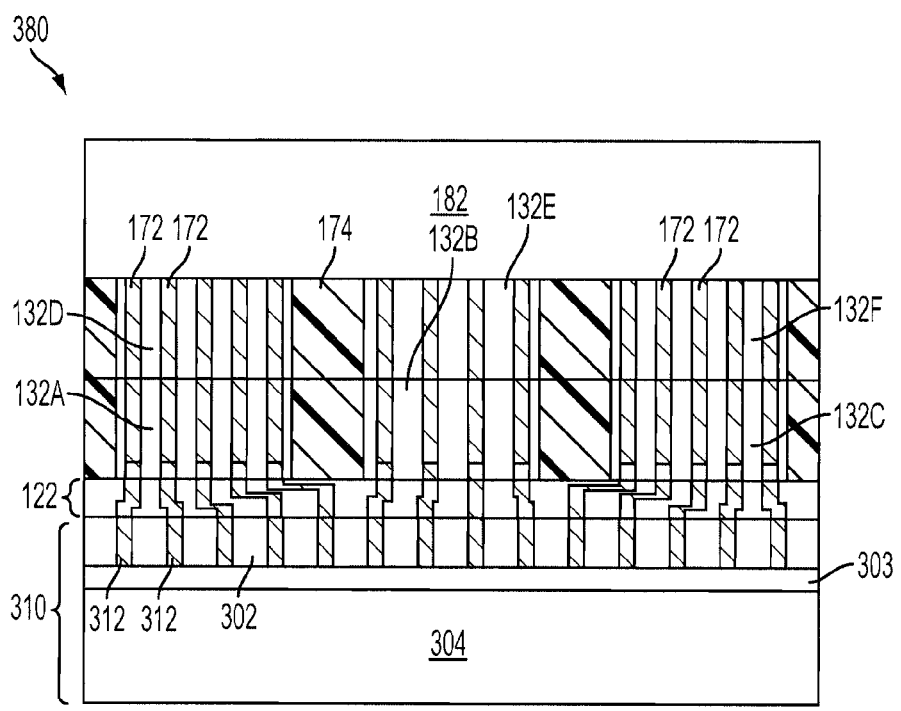

After forming the bonded semiconductor structure 380 of FIG. 2C, the insulator layer 303 and the substrate body 304 may be removed from the bonded semiconductor structure 380, as previously described. The substrate body 304 may be recovered and reused, as previously described herein. After removing the insulator layer 303 and the substrate body 304, the resulting bonded semiconductor structure may be processed as previously described with reference to FIGS. 1J through 1L.

As previously mentioned, in relation to FIG. 1K, in some embodiments, the additional structure 202 to which the bonded semiconductor structure 190 of FIG. 1J may be attached may comprise another processed semiconductor structure. An example of such a method is described below with reference to FIGS. 3A through 3D.

Figure 3A:
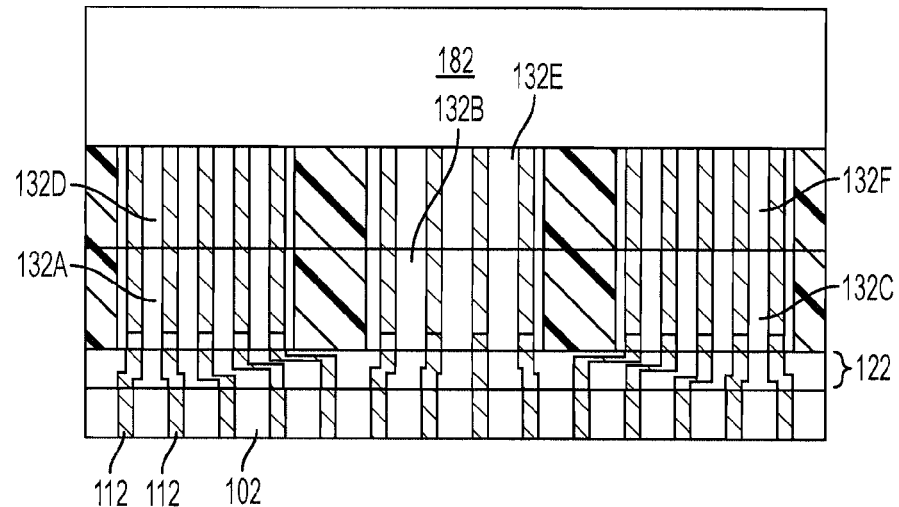
FIGS. 3A through 3D are simplified cross-sectional views of semiconductor structures and are used to describe yet further embodiments of methods of forming bonded semiconductor structures of the invention.

FIG. 3A illustrates a bonded semiconductor structure 400 that may be formed from the bonded semiconductor structure 180 by removing the substrate body 104 of the first substrate structure 120 therefrom, as previously described herein in relation to FIGS. 1I and 1J, but without providing the conductive bumps 192 (FIG. 1J) on the through wafer interconnects 112.

Figure 3B:
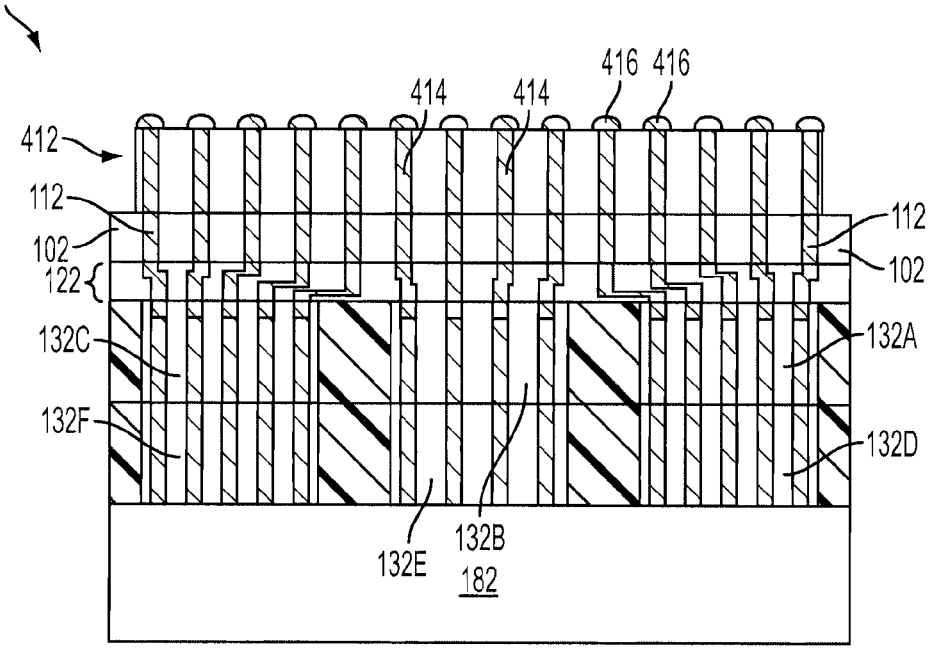

Referring to FIG. 3B, an additional processed semiconductor structure 412 may be directly bonded to the layer of material 102, the through wafer interconnects 112, or to both the layer of material 102 and the through wafer interconnects 112.

By way of example and not limitation, the additional processed semiconductor structure 412 may comprise a semiconductor die, and may include one or more of an electronic signal processor, a memory device, and an optoelectronic device (e.g., a light-emitting diode, a laser, a photodiode, a solar cell, etc.).

The direct bonding process used to bond the additional processed semiconductor structure 412 to the layer of material 102 and/or the through wafer interconnects 112 may be performed at a temperature or temperatures of about 400° C. or less. In some embodiments, the bonding process may comprise a thermo-compression direct bonding process performed at a temperature or temperatures of about 400° C. or less. In additional embodiments, the bonding process may comprise an ultra-low temperature direct bonding process performed at a temperature or temperatures of about 200° C. or less. In some instances, the bonding process may be performed at about room temperature. Additionally, the bonding process may comprise a surface-assisted bonding process in some embodiments. The direct bonding process may comprise an oxide-to-oxide (e.g., silicon dioxide-to-silicon dioxide) direct bonding process, and/or a metal-to-metal (e.g., copper-to-copper) direct bonding process.

As shown in FIG. 3B, additional through wafer interconnects 414 may be formed through the additional processed semiconductor structure 412. The additional through wafer interconnects 414 may be formed through the processed semiconductor structure 412 before or after directly bonding the additional processed semiconductor structure 412 to the layer of material 102 and/or the through wafer interconnects 112. At least some of the through wafer interconnects 414 may extend to, and may be structurally and electrically coupled with, through wafer interconnects 112 in the layer of material 102.

Optionally, a conductive bump 416 may be provided on the exposed end of each of the through wafer interconnects 414 to form the bonded semiconductor structure 410 of FIG. 3B, as previously described in relation to the conductive bumps 192 with reference to FIG. 1J.

Figure 3C:
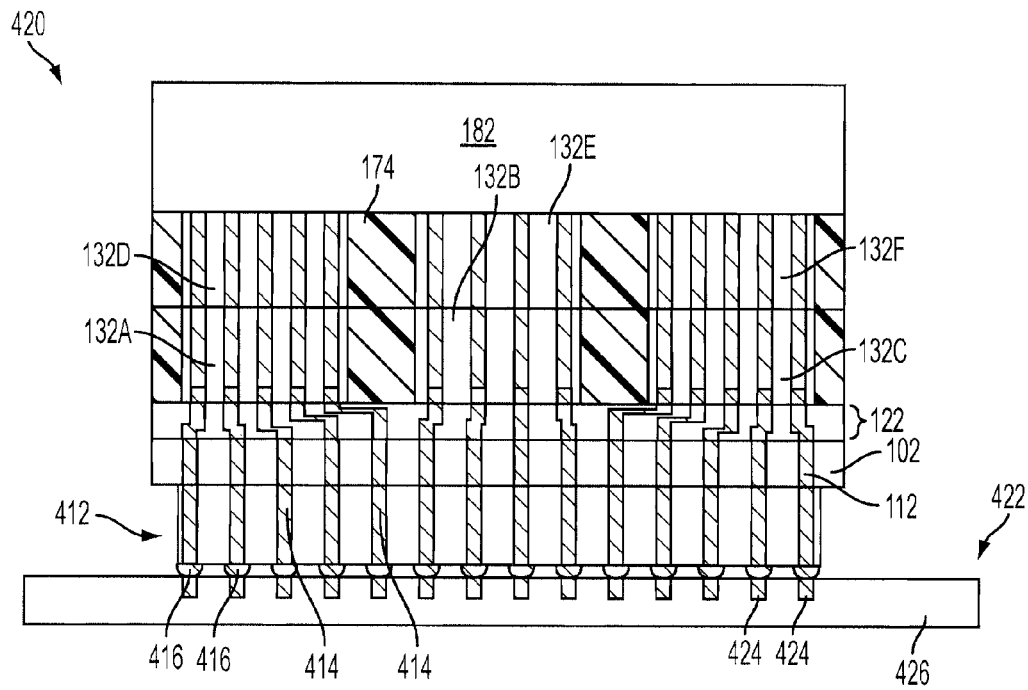

Referring to FIG. 3C, the bonded semiconductor structure 410 of FIG. 3B may be structurally and electrically coupled to a structure 422. For example, the structure 422 may comprise another processed semiconductor structure or a printed circuit board. As shown in FIG. 3C, the structure 422 may comprise a plurality of conductive features 424 and a surrounding dielectric material 426. The conductive features 424 may comprise bond pads, for example. The conductive bumps 416 may be aligned with and abutted against the conductive features 424. The conductive bumps 416 may be heated to cause the material of the conductive bumps 416 to reflow, after which the material may be cooled and solidified, thereby forming a structural and electrical bond between the through wafer interconnects 414 and the conductive features 424 of the structure 422.

Figure 3D:
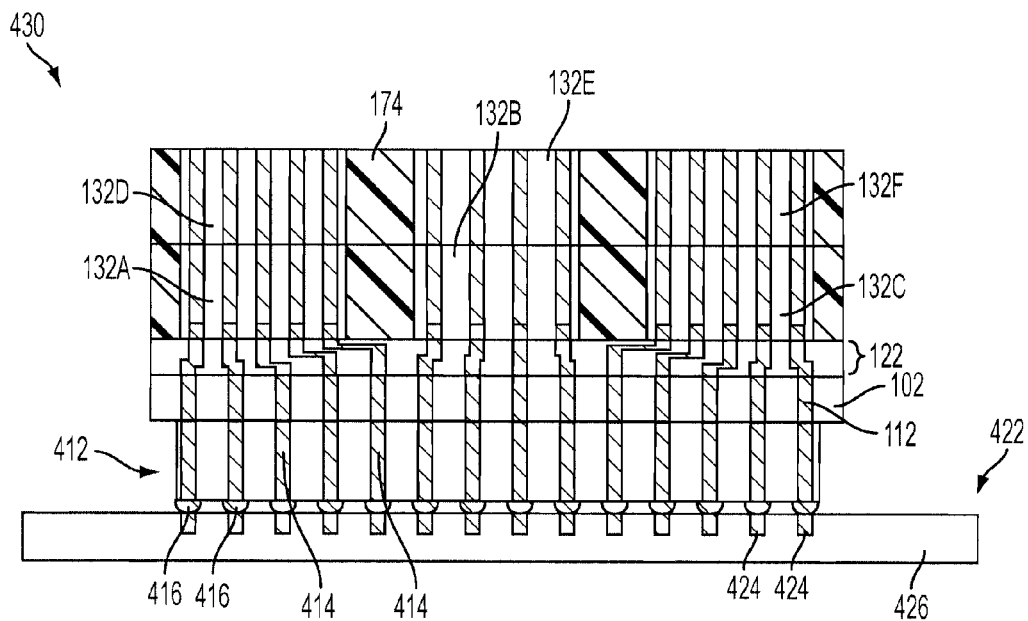

Referring to FIG. 3D, after structurally and electrically coupling the through wafer interconnects 414 to the conductive features 424 of the structure 422, the second substrate structure 182 (FIG. 3C) may be removed to form the bonded semiconductor structure 430 shown in FIG. 3D. For example, a mechanical splitting process, an etching process, or a combination of such processes may be used remove the second substrate structure 182 to form the bonded semiconductor structure 430.

After removing each of the relatively thick substrate body 104 of the first substrate structure 120 and the second substrate structure 182 from the bonded semiconductor structures, the relatively thick substrate body 104 and/or the second substrate structure 182 may be recovered and reused, as previously discussed herein.

The bonded semiconductor structure 430 of FIG. 3D may be further processed as needed or desirable in order to render the bonded semiconductor structure 430 suitable for its intended use. As a non-limiting example, a protective coating or encapsulating material may be provided over at least a portion of the bonded semiconductor structure 430, and/or a protective bonding material may be provided between the structure 422 and the processed semiconductor structure 412 between and around the conductive bumps 416.

In accordance with the methods described hereinabove, by maintaining the second substrate structure 182 bonded to the processed semiconductor structures 132A-132F until after the bonded semiconductor structures 200, 420 have been bonded to the additional structures 202, 422, warping, cracking, and other damage that might arise in the bonded semiconductor structures due to, for example, differences in thermal expansion coefficients of the various materials and devices therein, may be avoided or reduced.

Additional non-limiting example embodiments of the invention are described below.

Embodiment 1: A method of forming a bonded semiconductor structure, comprising: providing a first substrate structure comprising a relatively thin layer of material on a relatively thick substrate body; forming a plurality of through wafer interconnects through the relatively thin layer of material of the first substrate structure; bonding at least one processed semiconductor structure over the relatively thin layer of material of the first substrate structure on a side thereof opposite the relatively thick substrate body and electrically coupling at least one conductive feature of the at least one processed semiconductor structure with at least one through wafer interconnect of the plurality of through wafer interconnects; bonding a second substrate structure over the at least one processed semiconductor structure on a side thereof opposite the first substrate structure; removing the relatively thick substrate body of the first substrate structure and leaving the relatively thin layer of material of the first substrate structure bonded to the at least one processed semiconductor structure; and electrically coupling at least one through wafer interconnect of the plurality of through wafer interconnects to a conductive feature of another structure.

Embodiment 2: The method of Embodiment 1, further comprising removing the second substrate structure after electrically coupling the at least one through wafer interconnect of the plurality of through wafer interconnects to the conductive feature of the another structure.

Embodiment 3: The method of Embodiment 1 or Embodiment 2, wherein providing the first substrate structure further comprises temporarily bonding the relatively thin layer of material to the relatively thick substrate body, and wherein removing the relatively thick substrate body of the first substrate structure and leaving the relatively thin layer of material of the first substrate structure bonded to the at least one processed semiconductor structure comprises separating the relatively thick substrate body from the relatively thin layer of material.

Embodiment 4: The method of any of Embodiments 1 through 3, further comprising forming at least one redistribution layer over the relatively thin layer of material of the first substrate structure on the side thereof opposite the relatively thick substrate body prior to bonding the at least one processed semiconductor structure over the relatively thin layer of material of the first substrate structure, and wherein bonding the at least one processed semiconductor structure over the relatively thin layer of material of the first substrate structure comprises bonding the at least one processed semiconductor structure to the redistribution layer.

Embodiment 5: The method of any one of Embodiments 1 through 4, wherein bonding the at least one processed semiconductor structure over the relatively thin layer of material of the first substrate structure comprises bonding the at least one processed semiconductor structure over the relatively thin layer of material of the first substrate structure at a temperature or temperatures below about 400° C.

Embodiment 6: The method of any one of Embodiments 1 through 5, wherein bonding the at least one processed semiconductor structure over the relatively thin layer of material of the first substrate structure comprises bonding the at least one processed semiconductor structure over the relatively thin layer of material of the first substrate structure using an ultra-low temperature direct bonding process.

Embodiment 7: The method of any one of Embodiments 1 through 6, wherein bonding the at least one processed semiconductor structure over the relatively thin layer of material of the first substrate structure comprises bonding a plurality of processed semiconductor structures over the relatively thin layer of material of the first substrate structure.

Embodiment 8: The method of Embodiment 7, wherein at least some processed semiconductor structures of the plurality of processed semiconductor structures are disposed laterally beside one another along a common plane oriented parallel to a major surface of the first substrate structure.

Embodiment 9: The method of Embodiment 8, wherein at least some processed semiconductor structures of the plurality of processed semiconductor structures are disposed vertically over one another along a common line oriented perpendicular to a major surface of the first substrate structure.

Embodiment 10: The method of Embodiment 7, wherein at least some processed semiconductor structures of the plurality of processed semiconductor structures are disposed vertically over one another along a common line oriented perpendicular to a major surface of the first substrate structure.

Embodiment 11: The method of any one of Embodiments 1 through 10, further comprising selecting the another structure to comprise another processed semiconductor structure.

Embodiment 12: The method of any one of Embodiments 1 through 11, further comprising selecting the another structure to comprise a printed circuit board.

Embodiment 13: The method of any one of Embodiments 1 through 12, further comprising selecting the first substrate structure to comprise a semiconductor-on-insulator (SeOI) substrate.

Embodiment 14: The method of Embodiment 13, further comprising selecting the first substrate structure to comprise a silicon-on-insulator (SOI) substrate.

Embodiment 15: The method of any one of Embodiments 1 through 14, further comprising forming an additional plurality of through wafer interconnects through the at least one processed semiconductor structure after bonding the at least one processed semiconductor structure over the relatively thin layer of material of the first substrate structure.

Embodiment 16: The method of any one of Embodiments 1 through 15, further comprising reusing at least one of the second substrate structure and the relatively thick substrate body of the first substrate structure in a method of forming a bonded semiconductor structure.

Embodiment 17: An intermediate structure formed during fabrication of a bonded semiconductor structure, comprising: a first substrate structure, comprising: a plurality of through wafer interconnects extending through a relatively thin layer of material; and a relatively thick substrate body temporarily bonded to the relatively thin layer of material; a plurality of processed semiconductor structures electrically coupled to the plurality of through wafer interconnects; and a second substrate structure temporarily bonded over the plurality of processed semiconductor structures on a side thereof opposite the first substrate structure.

Embodiment 18: The intermediate structure of Embodiment 17, wherein the first substrate structure comprises a semiconductor-on-insulator (SeOI) substrate.

Embodiment 19: The intermediate structure of Embodiment 17 or Embodiment 18, wherein the relatively thin layer of material has an average thickness of about one hundred nanometers (100 nm) or less.

Embodiment 20: The intermediate structure of any one of Embodiments 17 through 19, wherein at least some processed semiconductor structures of the plurality of processed semiconductor structures are disposed laterally beside one another along a common plane oriented parallel to a major surface of the first substrate structure.

Embodiment 21: The intermediate structure of any one of Embodiments 17 through 20, wherein at least some processed semiconductor structures of the plurality of processed semiconductor structures are disposed vertically over one another along a common line oriented perpendicular to a major surface of the first substrate structure.

The example embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the invention. Such modifications and embodiments are also intended to fall within the scope of the appended claims.

What is claimed is:

1. A method of forming a bonded semiconductor structure, comprising:
    providing a first substrate structure comprising a relatively thin layer of material on a relatively thick substrate body;
    forming a plurality of through wafer interconnects through the relatively thin layer of material of the first substrate structure;
    forming at least one redistribution layer over the relatively thin layer of material of the first substrate structure on the side thereof opposite the relatively thick substrate body;
    directly bonding a plurality of processed semiconductor structures to the at least one redistribution layer, at least one conductive feature of each of the plurality of processed semiconductor structures respectively electrically coupled with at least one through wafer interconnect of the plurality of through wafer interconnects, each of the plurality of processed semiconductor structures occupying a different area over the first substrate structure;
    directly bonding a second substrate structure over the plurality of processed semiconductor structures on a side thereof opposite the first substrate structure;
    removing the relatively thick substrate body of the first substrate structure and leaving the relatively thin layer of material of the first substrate structure bonded to the plurality of processed semiconductor structures; and
    electrically coupling at least one through wafer interconnect of the plurality of through wafer interconnects to a conductive feature of another structure.

2. The method of claim 1, further comprising removing the second substrate structure after electrically coupling the at least one through wafer interconnect of the plurality of through wafer interconnects to the conductive feature of the another structure.

3. The method of claim 1, wherein providing the first substrate structure further comprises temporarily bonding the relatively thin layer of material to the relatively thick substrate body, and wherein removing the relatively thick substrate body of the first substrate structure and leaving the relatively thin layer of material of the first substrate structure bonded to the plurality of processed semiconductor structures comprises separating the relatively thick substrate body from the relatively thin layer of material.

4. The method of claim 1, wherein directly bonding the plurality of processed semiconductor structures over the relatively thin layer of material of the first substrate structure comprises directly bonding the plurality of processed semiconductor structures over the relatively thin layer of material of the first substrate structure at a temperature or temperatures below about 400° C.

5. The method of claim 1, wherein directly bonding the plurality of processed semiconductor structures over the relatively thin layer of material of the first substrate structure comprises directly bonding the plurality of processed semiconductor structures over the relatively thin layer of material of the first substrate structure using an ultra-low temperature direct bonding process.

6. The method of claim 1, wherein at least some processed semiconductor structures of the plurality of processed semiconductor structures are disposed laterally beside one another along a common plane oriented parallel to a major surface of the first substrate structure.

7. The method of claim 6, wherein at least some processed semiconductor structures of the plurality of processed semiconductor structures are disposed vertically over one another along a common line oriented perpendicular to a major surface of the first substrate structure.

8. The method of claim 1, wherein at least some processed semiconductor structures of the plurality of processed semiconductor structures are disposed vertically over one another along a common line oriented perpendicular to a major surface of the first substrate structure.

9. The method of claim 1, further comprising selecting the another structure to comprise another processed semiconductor structure.

10. The method of claim 1, further comprising selecting the another structure to comprise a printed circuit board.

11. The method of claim 1, further comprising selecting the first substrate structure to comprise a semiconductor-on-insulator (SeOI) substrate.

12. The method of claim 11, further comprising selecting the first substrate structure to comprise a silicon-on-insulator (SOI) substrate.

13. The method of claim 1, further comprising forming an additional plurality of through wafer interconnects through the at least one processed semiconductor structure after directly bonding the at least one processed semiconductor structure over the relatively thin layer of material of the first substrate structure.

14. The method of claim 1, further comprising reusing at least one of the second substrate structure and the relatively thick substrate body of the first substrate structure in a method of forming a bonded semiconductor structure.

15. The method of claim 1, wherein directly bonding a plurality of processed semiconductor structures to the at least one redistribution layer further comprises directly bonding the plurality of processed semiconductor structures laterally beside one another along a common plane oriented parallel to a major surface of the first substrate structure.

16. An intermediate structure formed during fabrication of a bonded semiconductor structure, comprising:
 a first substrate structure, comprising:
  a plurality of through wafer interconnects extending through a relatively thin layer of material; and
  a relatively thick substrate body temporarily bonded to the relatively thin layer of material;
 at least one redistribution layer over the relatively thin layer of material of the first substrate structure on the side thereof opposite the relatively thick substrate body;
 a plurality of processed semiconductor structures directly bonded to the at least one redistribution layer, each processed semiconductor structure of the plurality of processed semiconductor structures occupying a different area over the first substrate structure and electrically coupled to the plurality of through wafer interconnects; and
 a second substrate structure temporarily and directly bonded over the plurality of processed semiconductor structures on a side thereof opposite the first substrate structure.

17. The intermediate structure of claim 16, wherein the first substrate structure comprises a semiconductor-on-insulator (SeOI) substrate.

18. The intermediate structure of claim 16, wherein the relatively thin layer of material has an average thickness of about ten nanometers (10 nm) or less.

19. The intermediate structure of claim 16, wherein at least some processed semiconductor structures of the plurality of processed semiconductor structures are disposed laterally beside one another along a common plane oriented parallel to a major surface of the first substrate structure.

20. The intermediate structure of claim 19, wherein at least some processed semiconductor structures of the plurality of processed semiconductor structures are disposed vertically over one another along a common line oriented perpendicular to a major surface of the first substrate structure.

* * * * *